(12) United States Patent
Richmond, II et al.

(10) Patent No.: US 10,488,437 B2
(45) Date of Patent: Nov. 26, 2019

(54) ELECTRONICS TESTER WITH OUTPUT CIRCUITS OPERABLE IN VOLTAGE COMPENSATED POWER MODE, DRIVER MODE OR CURRENT COMPENSATED POWER MODE

(71) Applicant: Aehr Test Systems, Fremont, CA (US)

(72) Inventors: Donald P. Richmond, II, Palo Alto, CA (US); David S. Hendrickson, San Jose, CA (US)

(73) Assignee: AEHR TEST SYSTEMS, Fremont, CA (US)

( * ) Notice: Subject to any disclaimer, the term of this patent is extended or adjusted under 35 U.S.C. 154(b) by 0 days.

(21) Appl. No.: 15/845,038

(22) Filed: Dec. 18, 2017

(65) Prior Publication Data

US 2018/0106837 A1 Apr. 19, 2018

Related U.S. Application Data

(62) Division of application No. 14/918,038, filed on Oct. 20, 2015, now Pat. No. 9,874,583.

(60) Provisional application No. 62/066,276, filed on Oct. 20, 2014.

(51) Int. Cl.
*G01R 1/067* (2006.01)
*G01R 31/28* (2006.01)

(52) U.S. Cl.
CPC ..... *G01R 1/06766* (2013.01); *G01R 31/2879* (2013.01)

(58) Field of Classification Search
None
See application file for complete search history.

(56) References Cited

U.S. PATENT DOCUMENTS

| 4,240,021 A | 12/1980 | Kashima et al. |
|---|---|---|
| 4,517,512 A | 5/1985 | Petrich et al. |
| 5,467,024 A | 11/1995 | Swapp |
| 2005/0093561 A1 | 5/2005 | Watanabe et al. |
| 2007/0018681 A1 | 1/2007 | Sartschev |
| 2012/0136614 A1 | 5/2012 | Liu et al. |

OTHER PUBLICATIONS

International Search Report and Written Opinion dated Jan. 14, 2016, International PCT Application No. PCT/US15/56429 with International Filing Date of Oct. 20, 2015, (11 pages).

*Primary Examiner* — Paresh H Patel
(74) *Attorney, Agent, or Firm* — Stephen M. De Klerk

(57) ABSTRACT

A tester is described having output circuits that are operable in either power mode or driver mode. A switching circuit connects force and sense lines to one of the output circuits when in power mode, or connects the same lines separately to the output circuits when in driver mode. A further configuration allows for power to be provided through the lines separately while detecting a measure of power through each line and correcting for unknown resistances of leads connected to the lines.

14 Claims, 4 Drawing Sheets

ELECTRONICS TESTER WITH OUTPUT CIRCUITS OPERABLE IN VOLTAGE COMPENSATED POWER MODE, DRIVER MODE OR CURRENT COMPENSATED POWER MODE

CROSS-REFERENCE TO RELATED APPLICATIONS

This application is a division of U.S. patent application Ser. No. 14/918,038, filed on Oct. 20, 2015, which claims priority from U.S. Provisional Patent Application No. 62/066,276, filed on Oct. 20, 2014, all of which are incorporated herein by reference in their entirety.

BACKGROUND OF THE INVENTION

1). Field of the Invention
This invention relates to a tester for a device and to a method of testing a device.
2). Discussion of Related Art
Microelectronic circuits are usually fabricated in and on semiconductor wafers. Such a wafer is subsequently "singulated" or "diced" into individual dies. Such a die is typically mounted to a supporting substrate for purposes of providing rigidity thereto and electronic communication with an integrated or microelectronic circuit of the die. Final packaging may include encapsulation of the die and the resulting package can then be shipped to a customer.

It is required that the die or the package be tested before being shipped to a customer. Ideally, the die should be tested at an early stage for purposes of identifying the defects that occur during early stage manufacturing.

Such a die usually has power terminals and signal terminals. A tester usually includes a power supply and a driver circuit. Power is usually provided from the power supply through a power line to the power terminal of the die and signals such as data, clock and chip select signals are provided from the driver circuit through a signal line to the signal terminals of the die.

SUMMARY OF THE INVENTION

The invention provides a tester for a device including a first output circuit operating as either a power circuit or a driver circuit, a second output circuit operating as either a power circuit or a driver circuit, first and second lines, the first line connected to an output terminal of the first output circuit and a switching circuit operable to switch between either a power mode or a driver mode. In the power mode (i) the first output circuit may provide power through the output terminal of the first output circuit and the first line to a power terminal of the device, (ii) the second line may be connectable to the power terminal to serve as a sense line, (iii) the second line may be connected to a feedback terminal of the first output circuit and (iv) an output of the second output circuit may be disconnected from the second line. In the driver mode (i) the first output circuit may provide a driver signal through the output terminal of the first output circuit and the first line for delivery to a first signal terminal of the device, (ii) the second line may be disconnected from the first driver circuit and (iii) the output of the second output circuit may be connected to the second line to provide a driver signal through the second line to a second signal terminal of the device.

The tester may further include that the first output circuit may include at least a first amplifier with an input, a reference power being provided to the input in the power mode, and a driver input signal provided to the input terminal in the driver mode.

The tester may further include that the first output circuit may include at least a second amplifier providing a different power level output than the first amplifier, the reference power and driver input signal being provided to the first and second amplifiers, the switching circuit being operable to select either the first amplifier or the second amplifier.

The tester may further include a device connection resource that includes a holder for the device and connection leads releasably connecting the lines to the terminals of the device when held by the holder.

The device connection resource may be one of a probe card and a burn-in board.

The tester may further include that the switching circuit may include a first switch that connects the second line to the feedback terminal of the first output circuit and a second switch that connects the output of the second output circuit to the second line.

The invention also provides in a tester for a device comprising a first output circuit operating as either a power circuit or a driver circuit, a second output circuit operating as either a power circuit or a driver circuit, first and second lines, the first line connected to an output terminal of the first output circuit, and a switching circuit, a method of operating the switching circuit including switching the switching circuit between a power mode and a driver mode. In the power mode (i) the first output circuit may provide power through the output terminal of the first output circuit and the first line to a power terminal of the device, (ii) the second line may be connectable to the power terminal to serve as a sense line, (iii) the second line may be connected to a feedback terminal of the first output circuit and (iv) an output of the second output circuit may be disconnected from the second line. In the driver mode, (i) the first output circuit may provide a driver signal through the output terminal of the first output circuit and the first line for delivery to a first signal terminal of the device, (ii) the second line may be disconnected from the first driver circuit and (iii) the output of the second output circuit may be connected to the second line to provide a driver signal through the second line to a second signal terminal of the device.

The method may further include that the first output circuit may include at least a first amplifier with an input, a reference power being provided to the input in the power mode, and a driver input signal provided to the input terminal in the driver mode.

The method may further include that the first output circuit may include at least a second amplifier providing a different power level output than the first amplifier, the reference power and driver input signal being provided to the first and second amplifiers, the switching circuit being operable to select either the first amplifier or the second amplifier.

The method may further include that the tester further includes a device connection resource that includes a holder for the device and connection leads. The method further including releasably connecting the leads to the lines to connect the lines to the terminals.

The method may further include that the device connection resource may be one of a probe card and a burn-in board.

The method may further include that the switching circuit may include a first switch that connects the second line to the feedback terminal of the first output circuit and a second switch that connects the output of the second output circuit to the second line.

The invention further provides a tester for a device including a first output circuit having an input and an output based on the input, a first line connected to the output of the first output circuit, the first line having a first line resistance, a device connection resource that includes a first holder for a first device and a connection lead having a first lead resistance and connecting the line to a first terminal on the first device when held by the holder, a first detector detecting a measure of power provided from the output of the first circuit to the first terminal of the first device and a current compensation circuit connected to the detector and adjusting power provided to the input based on the measure of the power detected by the first detector.

The tester may further include a second output circuit having an input and an output based on the input, a second line connected to the output of the second output circuit, the second line having a second line resistance, a device connection resource that includes a second holder for a second device and a connection lead having a second lead resistance and connecting the line to a second terminal on the second device when held by the holder, a second detector detecting a measure of power provided from the output of the second circuit to the second terminal of the second device and a current compensation circuit connected to the detector and adjusting power provided to the input based on the measure of the power detected by the second detector.

The tester may further include that the first lead resistance may be different than the second lead resistance.

The tester may further include that the first and second leads may be releasably connected to the first and second lines respectively.

The tester may further include that the detector may include a resistor in the first line and a voltage measurement device measuring a voltage over the first resistor.

The tester may further include that the resistance compensating circuit may include an adder that adds an input voltage and a voltage measured by the detector, and a multiplier that multiplies an output of the adder by a factor.

The tester may further include that the multiplier may include a variable resistor.

The invention also provides a method of testing a device including holding the device, connecting a first lead between a first line and a first terminal of the device, the first line having a first line resistance and the first lead having a first lead resistance, providing an input current to a first input circuit, the first line connected to an output of the first input circuit, detecting a measure of power provided by the first input circuit to the first terminal; and adjusting power provided to an input of the first input circuit based on the measure of the power.

The method may further include connecting a second lead between a second line and a second terminal of the device, the second line having a second line resistance and the second lead having a second lead resistance, providing an input current to a second input circuit, the second line connected to an output of the second input circuit, detecting a measure of power provided by the second input circuit to the first terminal and adjusting power provided to an input of the second input circuit based on the measure of the power.

The method may further include that the first lead resistance is different than the second lead resistance.

The method may further include releasably connecting the first and second leads to the first and second lines respectively.

The method may further include measuring a voltage over a resistor in the first line to determine the measure of power.

The method may further include adding an input voltage and measure of power to obtain a sum and multiplying the sum with a factor, to adjust the power.

The method may further include that the sum is multiplied with a multiplier having a variable resistor.

BRIEF DESCRIPTION OF THE DRAWINGS

The invention is described by way of example with reference to the accompanying drawings, wherein.

DETAILED DESCRIPTION OF THE INVENTION

Figure 1:
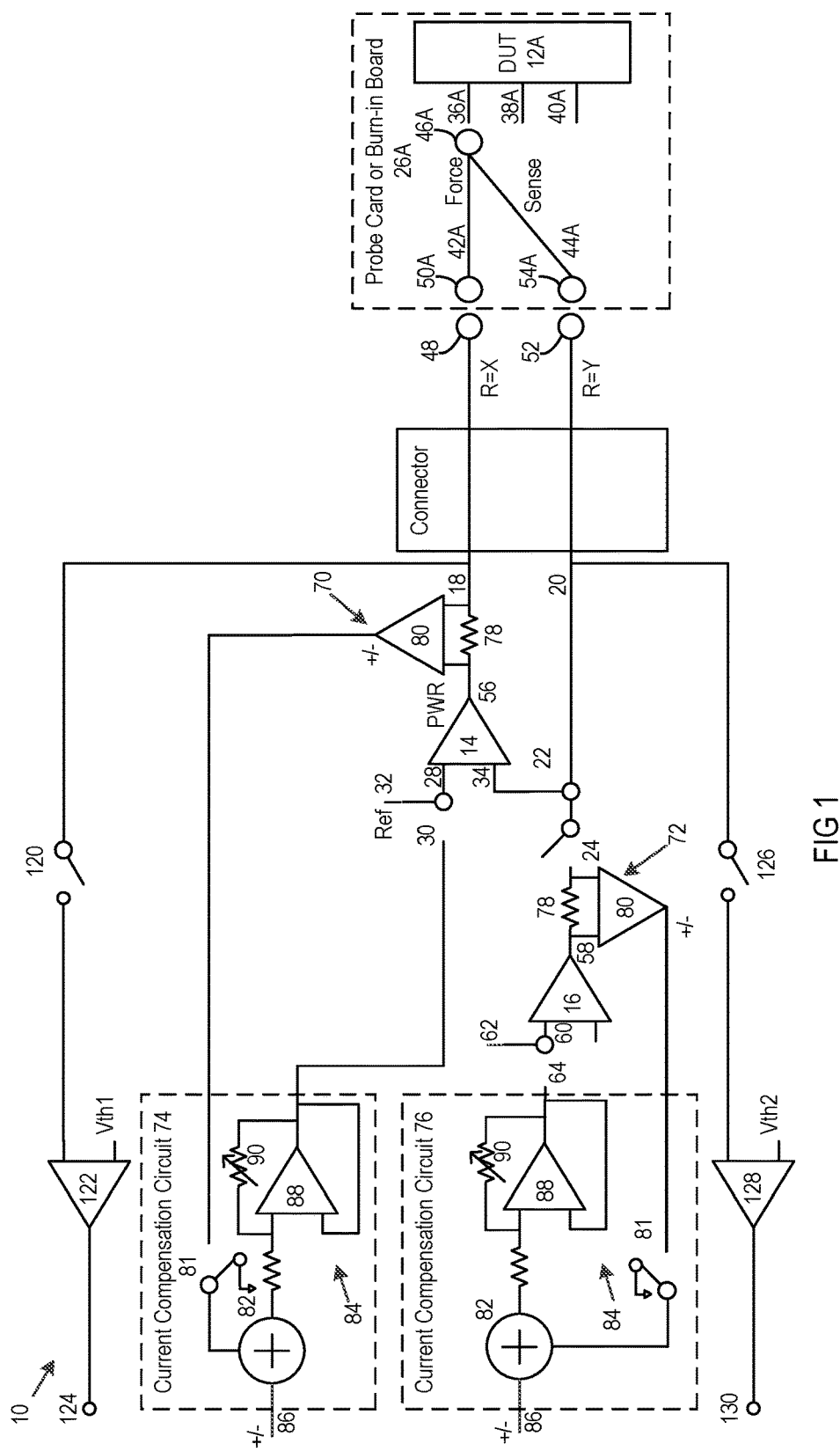
FIG. 1 is circuit diagram of components of a tester for a device wherein the tester is configured for providing voltage compensated power.

FIG. 1 of the accompanying drawings illustrates a tester 10 for a device 12A, including first and second output circuits 14 and 16, first and second lines 18 and 20, a switching circuit including first and second switches 22 and 24, and a device connection resource in the form of a probe card or burn-in board 26A.

The first output circuit 14 operates as either a power circuit or a driver circuit. In FIG. 1, the first output circuit 14 operates as a power circuit. The first output circuit 14 is a first amplifier with an input 28 connected via a switch 30 to a terminal 32. Reference power is provided to the terminal 32.

The second output circuit 16 operates as either a power circuit or a driver circuit. The second switch 24 disconnects the second output circuit 16 from the second line 20. The first switch 22 connects the second line 20 to a feedback terminal 34 of the first output circuit 14.

The probe card or burn-in board 26A includes a holder (not shown) for the device 12A. The device 12A is inserted into the holder before being tested and removed from the holder after testing. The device 12A has a plurality of terminals 36A, 38A and 40A. In the present example, the terminal 36A is a power terminal. The probe card or burn-in board 26A has been configured so that first and second leads 42A and 44A are connected to a terminal 46A that makes contact with the terminal 36A. The first line 18 is releasably connected to the first lead 42A via terminals 48 and 50A. Similarly, the second line 20 is releasably connected to the second lead 44A via terminals 52 and 54A.

Reference power provided to the terminal 32 is amplified by the first input circuit 14. An output 56 of the first output circuit 14 is connected to the first line 18. Output power provided through the output 56 of the first output circuit 14 then reaches the terminal 36A of the device 12A via the first line 18, first lead 42A and the terminal 46A. The first line 18 and first lead 42A jointly form a force line.

A sense line is formed by the second lead 44A, second line 20 and first switch 22. The first output circuit 14 receives a feedback through the sense line at the feedback terminal 34. Because both force and sense lines are included, very accurate voltage control can be provided to the terminal 36A of the device 12A.

Figure 2:
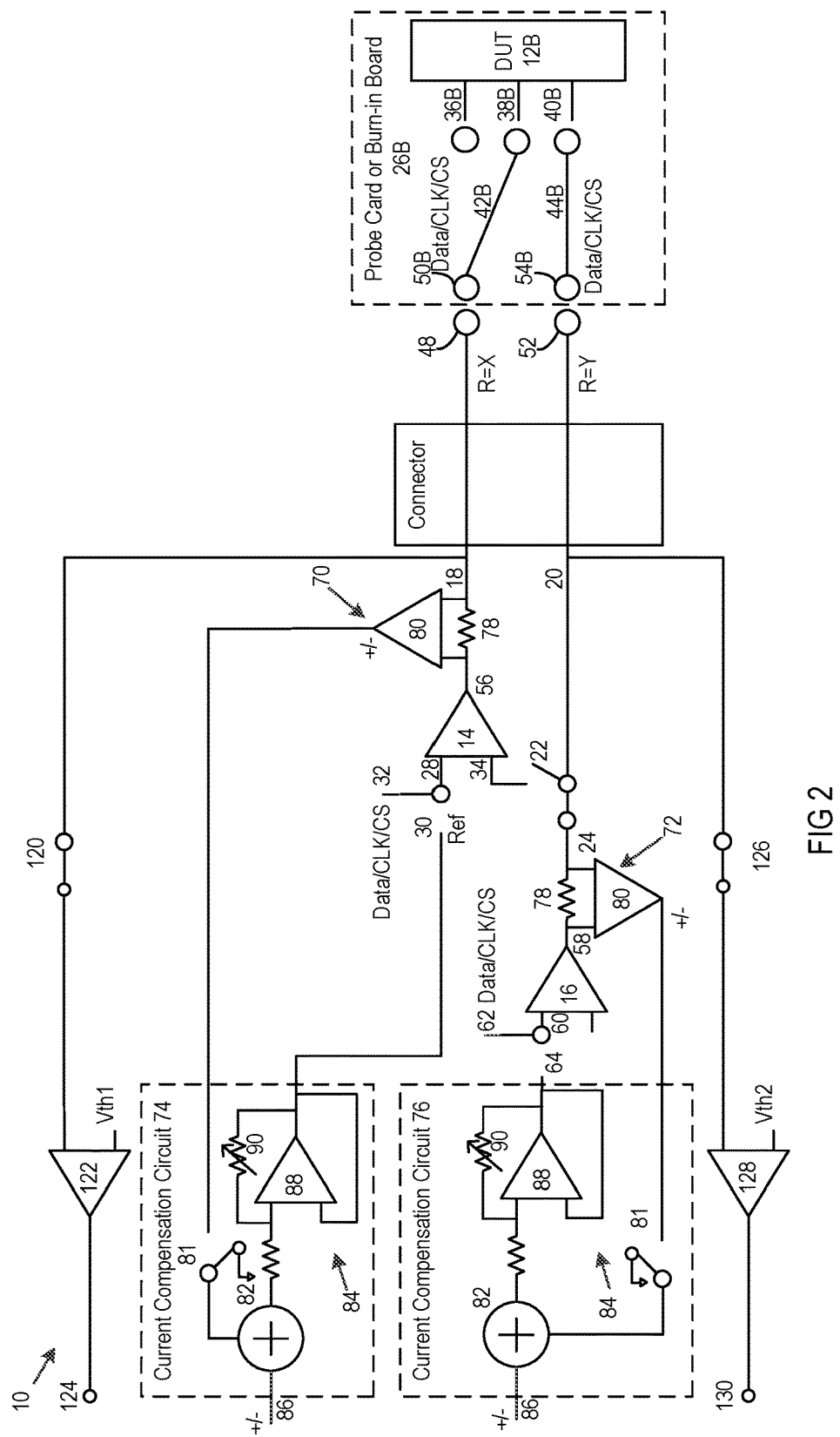
FIG. 2 is a circuit diagram similar to FIG. 1 wherein the tester is configured to provide driver signal data such as i/o data, clock and chip select data.

FIG. 2 shows the same tester 10, but with a different probe card or burn-in card 26B than the probe card or burn-in card 26A shown in FIG. 1. Like reference numerals indicate like or similar components. The device 12B has two signal terminals 38B and 40B. The first lead 42B connects the first line 18 to the first signal terminal 38B. The second lead 44B connects the second line 20 to the second signal terminal 40B. The first and second output circuits 14 and 16 operate in driver mode. The first switch 22 disconnects the second line 20 from the feedback terminal 34 of the first output circuit 14. The second switch 24 connects an output 58 of the second output circuit 16 to the second line 20. The outputs 56 and 58 of the first and second output circuits 14 and 16 are thus connected to the first and second signal terminals 38B and 40B of the device 12B, respectively.

An input 60 of the second output circuit 16 is connected to a terminal 62 via a switch 64. Separate driver signals in the form of data, clock, or chip select signals are provided to the terminals 32 and 62. The first and second output circuits 14 and 16 include amplifiers that amplify the driver signals and provide the amplified driver signals via the outputs 56 and 58 to the first and second signal terminals 38B and 40B of the device 12B.

It can thus be seen that the same circuitry of the tester 10 can provide power to the power terminal 36A in FIG. 1 or to the signal terminals 38B and 40B in FIG. 2. Moreover, there is no need for increase in the number of lines as the same lines 18 and 20 are used in the arrangements of FIGS. 1 and 2.

The first line 18 is connected through a first comparator switch 120 to a first input terminal of a first comparator 122. A first threshold voltage Vth1 is applied to a second input terminal of the first comparator 122. An output terminal of the first comparator 122 is connected to a first test result terminal 124. The first comparator switch 120 is open in FIG. 1, but closed in FIG. 2. The first comparator 122 in FIG. 2 provides an output to the first test result terminal 124 when the voltage on the first line is not equal to Vth1. The voltage on the first test result terminal 124 is in proportion to the difference between the voltage on the first line and Vth1.

A second comparator switch 126 connects the second line 20 to a first input terminal of a second comparator 128. A second threshold voltage Vth2 is applied to a second input terminal of the second comparator 128 and an output terminal of the second comparator 128 is connected to a second test result terminal 130. The functioning of the second comparator 128 is the same as the functioning of the first comparator 122.

Figure 3:
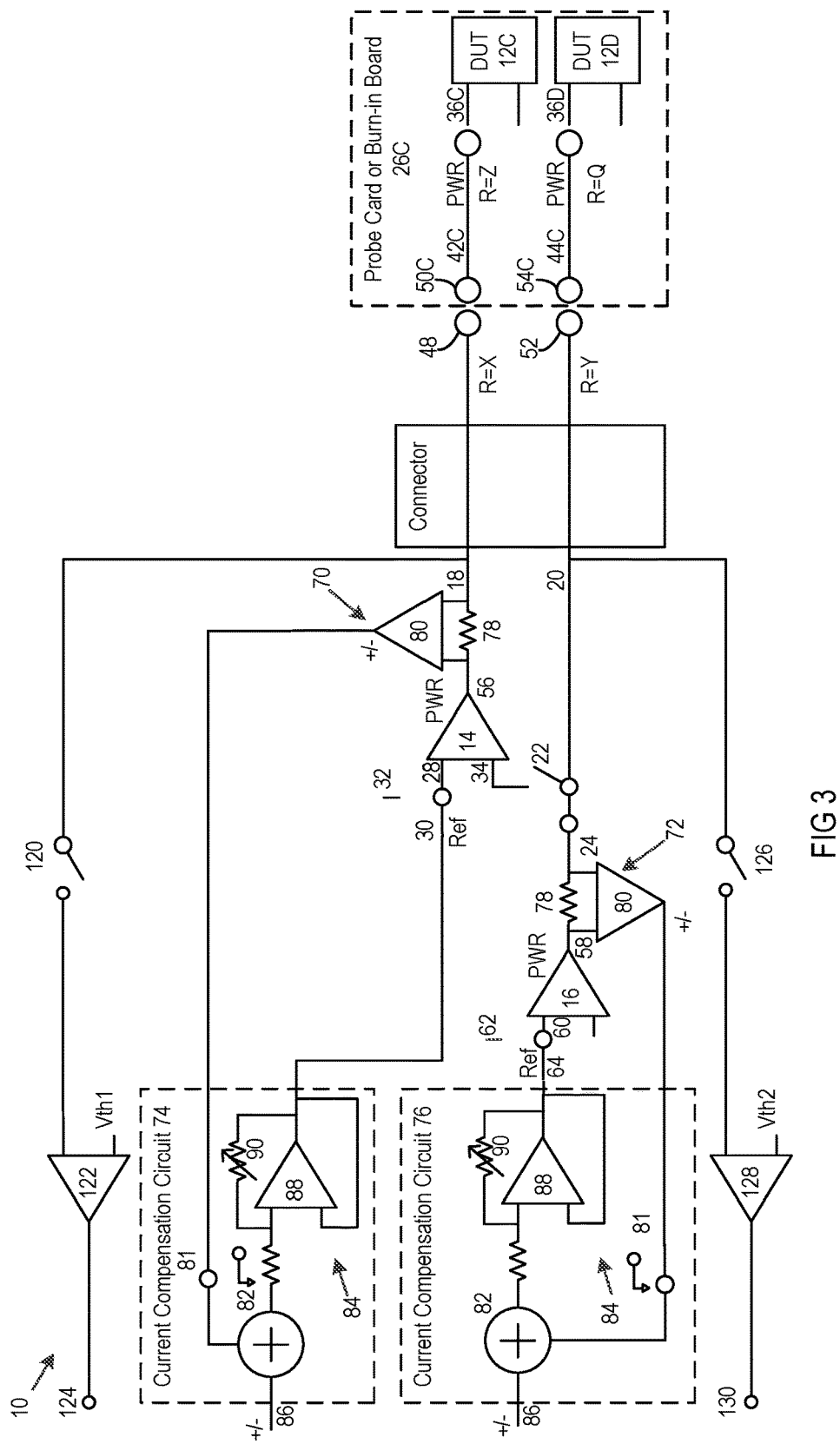
FIG. 3 is circuit diagram similar to FIGS. 1 and 2 wherein the tester is configured to provide current compensated power.

FIG. 3 illustrates a third configuration of the tester 10 with a further probe card or burn-in board 26C that is different than in FIGS. 1 and 2. The probe card or burn-in board 26C includes a holder or holders for two devices 12C and 12D. The device 12C has a power terminal 36C and the device 12D has a power terminal 36D. First and second leads 42C and 44C are releasably connected to the lines 18 and 20. The first switch 22 is open so as to disconnect the second line 20 from the first output circuit 14. The second switch 24 is closed so that the second output circuit 16 is connected to the second line 20. The first line 18 has a first line resistance (R=X). The first lead 42C has a first lead resistance (R=Z).

The second line 20 has second line resistance (R=Y). The second lead 44C has a second lead resistance (R=Q). The resistances of the first and second lines 18 and 20 are known to the manufacturer of the tester 10. The probe card or burn-in board 26C may be made by a different manufacturer and the resistances of the first and second leads 42C and 44C may not be known to the manufacturer of the tester 10.

The first and second output circuits 14 and 16 are separately connected to the power terminals 36C and 36D.

The tester 10 further includes detectors 70 and 72 and current compensation circuits 74 and 76. The detector 70 includes a resistor 78 and an amplifier 80. The resistor 78 is located within the line 18. The amplifier 80 measures a differential voltage over the resistor 78. By measuring the differential voltage, the detector 70 thus measures the current provided through the line 18, the current being a measure of power according to the equation $P=IV=I^2R=V^2/R$. The amplifier 80 is connected to the current compensation circuit 74. The current compensation circuit 74 includes a connection switch 81, an adder 82 and a multiplier 84. The connection switch 81 is open in FIGS. 1 and 2 so that the adder 82 is connected to ground. The connection switch 81 is closed in FIG. 3 so that the adder 82 receives a reference voltage at an input terminal 86. The adder 82 is connected to the amplifier 80. The adder 82 adds the voltage measured by the amplifier 80 to the reference voltage at the input terminal 86, to generate a sum. The multiplier 84 multiplies the sum by a factor. The multiplier includes an amplifier 88 and a variable resistor 90. The variable resistor 90 is set to approximate the resistance of the first line 18. The resistance of the first lead 42C results in an adjustment of the reference signal provided to the input 28 of the first output circuit 14. The switch 30 is closed so that the reference signal provided by the current compensation circuit 74 reaches the input 28 of the first output circuit 14. Should the current through the first line 18 become high, the current compensation circuit 74 will increase the voltage, and when the current within the first line 18 is low, the current compensation circuit 74 decreases the voltage.

The second detector 72 has a resistor 78 and amplifier 80 similar to the resistor 78 and amplifier 80 of the detector 70. The current compensation circuit 76 has a connection switch 81, an adder 82 and multiplier 84 similar to the current compensation circuit 74.

The first and second lines 18 and 20 may have different resistances. Similarly the first and second leads 42C and 44C may have different resistances. The variable resistors 90 of the current compensation circuits 74 and 76 may be set to different values. In addition, the detectors 70 and 72 may detect different voltages and the current compensation circuits 74 and 76 may compensate for the voltages detected by the detectors 70 and 72 to different degrees.

The configuration of FIG. 3 provides less assurance of voltage accuracy than the configuration of FIG. 1. However, in FIG. 3, the lines 18 and 20 can separately provide power to terminals of devices.

Figure 4:
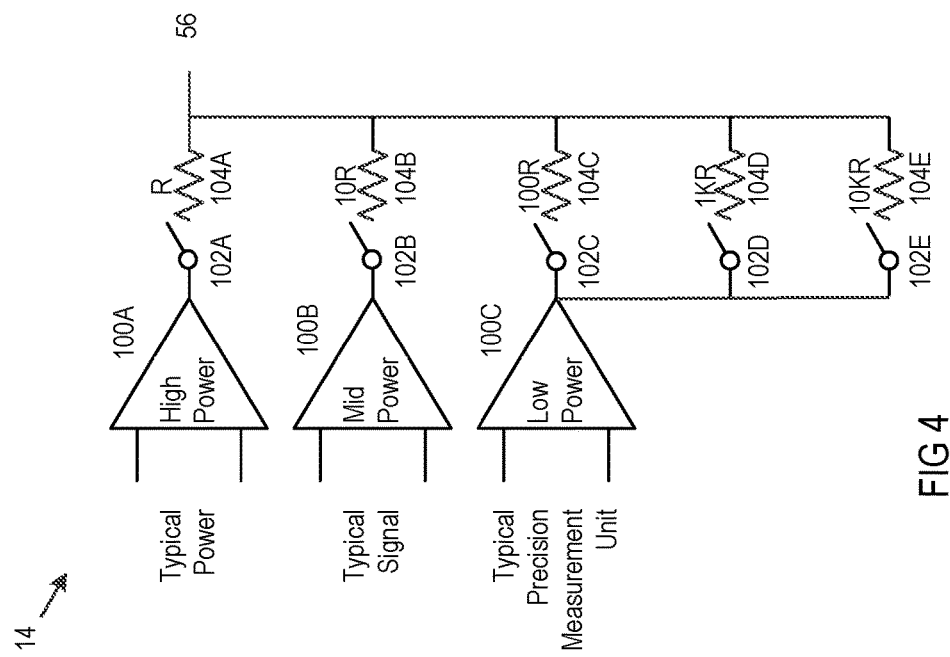
FIG. 4 is a circuit diagram of a first output circuit forming part of the tester.

As shown in FIG. 4, the first output circuit 14 includes three amplifiers 100A, 100B and 100C in parallel. The amplifiers 100A, 100B and 100C have their outputs connected via respective switches 102A, 102B, 102C, 102D and 102E and resistors 104A, 104B, 104C, 104D and 104E to the output 56. Typically, each one of the switches 102A, 102B, 102C, 102D and 102E is closed while the other switches are open. The amplifier 100A is a high power amplifier that is used for providing typical power. The resistor 104A has a resistance of a particular magnitude referred to as R. The amplifier 102B is a mid-power amplifier that is typically used for signals. The resistor 104B has a resistivity that is approximately ten times, shown as 10R, the resistivity of the resistor 104A. The amplifier 100C is a low power amplifier that is typically used for a precision measurement unit. The resistors 104C, 104D and 104E have resistivities that scale up by a factor of 10. One or more of the resistors 104C, 104D and 104E can be selected ones of the switches 102C, 102D and 102E.

The resistors 104A, 104B, 104C, 104D and 104E are used for measuring power that is provided through the respective resistor. Such measurements can be used for feedback control as described with reference to FIG. 3. Alternatively or in addition, the resistors can be used for determining a power provided and logging the power for later analysis.

The second output circuit 16 shown in FIGS. 1, 2 and 3 has the same configuration as the first output circuit 14 shown in FIG. 4. The switch 24 shown in FIGS. 1, 2 and 3 typically takes the form of one of the switches 102A, 102B, 102C, 102D and 102E.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A tester for a device comprising:
   a first output circuit having an input and an output based on the input;
   a first line connected to the output of the first output circuit, the first line having a first line resistance;
   a device connection resource that includes:
      a first holder for a first device; and
      a connection lead having a first lead resistance and connecting the first line to a first terminal on the first device when held by the holder;
      a first detector detecting a measure of power provided from the output of the first circuit to the first terminal of the first device; and
      a current compensation circuit connected to the detector and adjusting power provided to the input based on the measure of the power detected by the first detector.

2. The tester of claim 1, further comprising:
   a second output circuit having an input and an output based on the input;
   a second line connected to the output of the second output circuit, the second line having a second line resistance;
   a device connection resource that includes:
      a second holder for a second device; and
      a connection lead having a second lead resistance and connecting the line to a second terminal on the second device when held by the holder;
      a second detector detecting a measure of power provided from the output of the second circuit to the second terminal of the second device; and
      a current compensation circuit connected to the detector and adjusting power provided to the input based on the measure of the power detected by the second detector.

3. The tester of claim 2, wherein the first lead resistance is different than the second lead resistance.

4. The tester of claim 2, wherein the first and second leads are releasably connected to the first and second lines respectively.

5. The tester of claim 1, wherein the detector includes a resistor in the first line and a voltage measurement device measuring a voltage over the first resistor.

6. The tester of claim 1, wherein the resistance compensating circuit includes an adder that adds an input voltage and a voltage measured by the detector, and a multiplier that multiplies an output of the adder by a factor.

7. The tester of claim 6, wherein the multiplier includes a variable resistor.

8. A method of testing a device comprising:
   holding the device;
   connecting a first lead between a first line and a first terminal of the device, the first line having a first line resistance and the first lead having a first lead resistance;
   providing an input current to a first input circuit, the first line connected to an output of the first input circuit;
   detecting a measure of power provided by the first input circuit to the first terminal; and
   adjusting power provided to an input of the first input circuit based on the measure of the power.

9. The method of claim 8, further comprising:
   connecting a second lead between a second line and a second terminal of the device, the second line having a second line resistance and the second lead having a second lead resistance;
   providing an input current to a second input circuit, the second line connected to an output of the second input circuit;
   detecting a measure of power provided by the second input circuit to the first terminal; and
   adjusting power provided to an input of the second input circuit based on the measure of the power.

10. The method of claim 9, wherein the first lead resistance is different than the second lead resistance.

11. The method of claim 9, further comprising:
    releasably connecting the first and second leads to the first and second lines respectively.

12. The method of claim 8, further comprising:
    measuring a voltage over a resistor in the first line to determine the measure of power.

13. The method of claim 8, further comprising:
    adding an input voltage and measure of power to obtain a sum; and
    multiplying the sum with a factor, to adjust the power.

14. The method of claim 13, wherein the sum is multiplied with a multiplier having a variable resistor.

* * * * *